(12) United States Patent
Cho et al.

(10) Patent No.: US 10,109,346 B2
(45) Date of Patent: Oct. 23, 2018

(54) APPARATUS HAVING A MEMORY CELL AND A SHUNT DEVICE

(71) Applicant: Hewlett Packard Enterprise Development LP, Houston, TX (US)

(72) Inventors: Hans S. Cho, Palo Alot, CA (US); Gary Gibson, Palo Alto, CA (US); Brent Buchanan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/320,788

(22) PCT Filed: Jul. 30, 2014

(86) PCT No.: PCT/US2014/048918
§ 371 (c)(1),
(2) Date: Dec. 21, 2016

(87) PCT Pub. No.: WO2016/018313
PCT Pub. Date: Feb. 4, 2016

(65) Prior Publication Data
US 2017/0200495 A1   Jul. 13, 2017

(51) Int. Cl.
*G11C 11/00* (2006.01)
*G11C 13/00* (2006.01)
(Continued)

(52) U.S. Cl.
CPC ........ *G11C 13/004* (2013.01); *G11C 13/0007* (2013.01); *G11C 13/0069* (2013.01);
(Continued)

(58) Field of Classification Search
CPC ............ G11C 11/4091; G11C 16/0491; G11C 17/126; G11C 11/4074; G11C 2029/5004;
(Continued)

(56) References Cited

U.S. PATENT DOCUMENTS

| | | | |
|---|---|---|---|
| 5,701,071 A | * | 12/1997 | Liou ...................... G05F 3/262 323/220 |
| 7,791,927 B1 | | 9/2010 | Koriuchi |
| 2009/0027954 A1 | | 1/2009 | Kang et al. |
| 2011/0169136 A1 | | 7/2011 | Pickett et al. |
| 2013/0001501 A1 | | 1/2013 | Sills |
| 2013/0003437 A1 | | 1/2013 | Siau |

(Continued)

FOREIGN PATENT DOCUMENTS

| KR | 2013-0142761 A | 12/2013 |
|---|---|---|
| WO | WO-2013046217 A2 | 4/2013 |

OTHER PUBLICATIONS

International Searching Authority, The International Search Report and the Written Opinion, PCT/US2014/043918, dated Feb. 25, 2015, 10 Pages.

(Continued)

*Primary Examiner* — Thong Q Le
(74) *Attorney, Agent, or Firm* — Mannava & Kang, P.C.

(57) ABSTRACT

According to an example, an apparatus may include an input line, an output line, and a memory cell connected between the input line and the output line. The memory cell may include a memristor connected in series with a selector. The apparatus may also include a shunt device connected to the input line, in which the shunt device is to divert a portion of current away from the memory cell in response to a voltage at the input line being greater than a threshold voltage.

16 Claims, 6 Drawing Sheets

(51) Int. Cl.
*H01L 27/24* (2006.01)
*H01L 45/00* (2006.01)

(52) U.S. Cl.
CPC ...... *H01L 27/2463* (2013.01); *H01L 45/1233* (2013.01); *H01L 45/146* (2013.01)

(58) Field of Classification Search
CPC ..... G11C 29/021; G11C 29/028; G11C 5/145; G11C 11/16; G11C 11/22; G11C 11/4094; G11C 11/413; G11C 16/24; G11C 17/12
USPC ......... 365/145, 154, 185.16, 189.15, 189.16, 365/203, 100, 104, 117, 149, 156, 160, 365/162, 170, 175, 183, 185.11, 185.14
See application file for complete search history.

(56) References Cited

U.S. PATENT DOCUMENTS

| | | |
|---|---|---|
| 2013/0161583 A1 | 6/2013 | Blomme et al. |
| 2013/0208532 A1 | 8/2013 | Meade |
| 2014/0268975 A1* | 9/2014 | Kitagawa ................. G11C 7/18 365/63 |

OTHER PUBLICATIONS

Yang, J.J. et al., Memristive Devices for Computing: Mechanisms, Applications and Challenges, USLI Process Integration 8 at the 224th Electrochemical Society Meeting, San Francisco, Oct. 27-Nov. 1, 2013 (published Jul. 21, 2013), pp. 1-7.

* cited by examiner

APPARATUS HAVING A MEMORY CELL AND A SHUNT DEVICE

BACKGROUND

A memristor may generally be defined as an electrically actuated apparatus formed of a pair of spaced apart electrodes with a switching element positioned between the electrodes. Memristors are able to change the value of their resistances in response to various programming conditions and are able to exhibit a memory of past electrical conditions. For instance, memristors may be programmed to respectively represent a logical "1" or ON while in a low resistance state and a logical "0" or OFF while in a high resistance state and may retain these states. Particularly, the resistance state of the switching element may be changed through application of a current, in which the current may cause mobile dopants in the switching element to move, which may alter the electrical operation of the memristor. After removal of the current, the locations and characteristics of the dopants remain stable until the application of another programming electrical field. The state of the memristor may be read by applying a lower reading voltage across the switching element which allows the internal electrical resistance of the memristor to be sensed but does not generate a sufficiently high electrical field to cause significant dopant motion.

BRIEF DESCRIPTION OF THE DRAWINGS

Features of the present disclosure are illustrated by way of example and not limited in the following figure(s), in which like numerals indicate like elements, in which.

DETAILED DESCRIPTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to.

A crossbar memory array includes a plurality of memory cells. Each memory cell may include a selector connected in series with a memory element. Some implementations of the selectors are inherently sensitive to temperature and may admit unintended or excessive current into the memory elements, which may result in mis-reads or unintended writes. The temperature-dependent behavior of the selectors may thus introduce variations of the performance of the crossbar memory array.

Disclosed herein are an apparatus and a method for fabricating the apparatus. The apparatus may include an input line, an output line a memory cell connected between the input line and the output line, in which the memory cell includes a memory element connected in series with a selector, and a shunt device connected to the input line. The shunt device may be positioned upstream of the memory element with respect to a voltage driver to thus divert a portion of current away from the memory cell in response to a voltage at the input line being greater than a threshold voltage. The threshold voltage may be equivalent to a threshold voltage at which the selector changes from a high resistance state to a low resistance state.

According to an example, the shunt device may be made of the same materials as the selector. In this example, the shunt device may be affected similarly to the selector by temperature variations. As such, for instance, the shunt device may become activated under the same conditions as the selector and may thus divert current from the memory cell when the voltage exceeds a threshold voltage of the selector. Through implementation of the shunt device disclosed herein, compensation for excessive current flow to memory elements of memory cells caused by variations in temperature may be provided.

Figure 1:
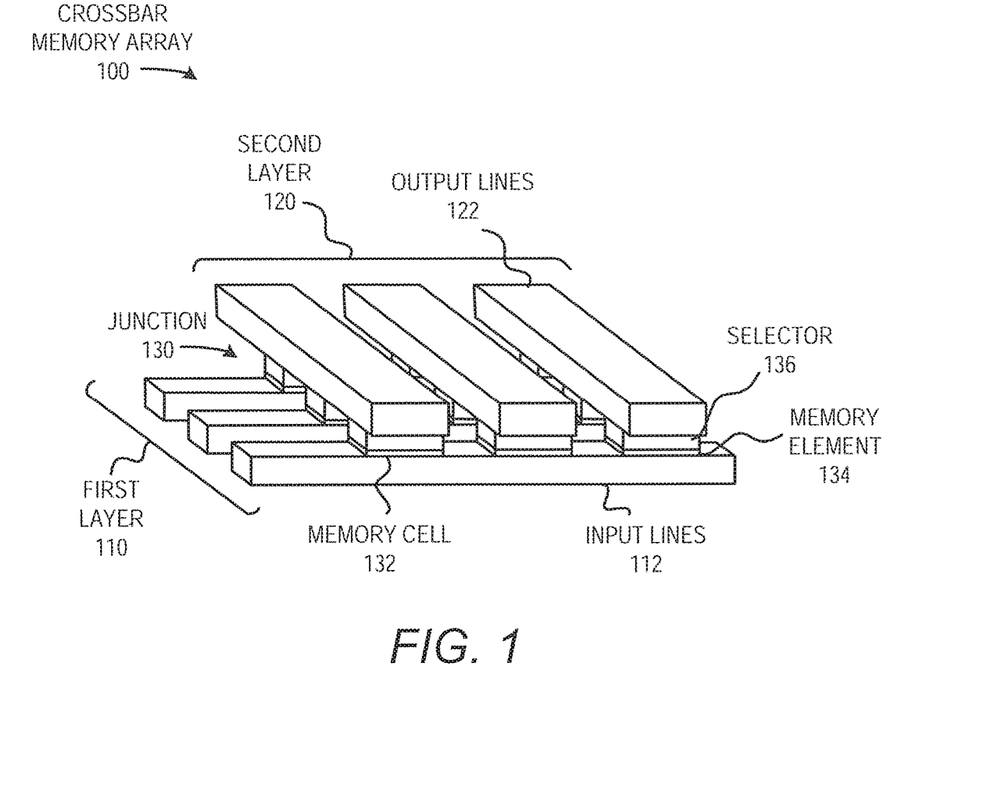
FIG. 1 shows a perspective view of a portion of a crossbar memory array, according to an example of the present disclosure.

FIG. 1 illustrates a perspective view of a portion of a crossbar memory array 100, according to an example. It should be understood that the crossbar memory array 100 depicted in FIG. 1 may include additional components and that some of the components described herein may be removed and/or modified without departing from a scope of the crossbar memory array 100.

As shown in FIG. 1, the crossbar memory array 100 includes a first layer 110 formed of a plurality of input lines 112 and a second layer 120 formed of a plurality of output lines 122. The input lines 112 are depicted as extending along a first plane and the output lines 122 are depicted as extending along a second plane, in which the second plane is parallel or nearly parallel to the first plane. The input lines 112 and the output lines 122 are also depicted as being in a crossed relationship with respect to each other such that junctions 130 are formed at intersections between respective pairs of the input lines 112 and output lines 122. That is, the input lines 112 are depicted as extending in a direction that is perpendicular to the direction in which the output lines 122 extend.

The output lines 122 are further depicted as being in a spaced relationship with respect to the input lines 112 such that a gap exists between the input lines 112 and the output 122. In addition, memory cells 132 are depicted as being positioned at the junctions 130. The memory cells 132 may each include a memory element 134 and a selector 136. The memory element 134 may be an element that may represent different values under different conditions such as a memristor, a bipolar nonlinear element, etc.

The input lines 112 may be formed of an electrically conductive material, such as W, Al, Cu, TiN, AlCu, AlCuSi, AlCuSi with a barrier layer, such as TiN, or the like. The output lines 122 may be formed of any of the example materials listed for the input lines 112. In addition, the output lines 122 may be formed of the same or different materials as compared with the input lines 112. The output lines 122 may be formed of an electrically conductive material, such as W, Al, Cu, TiN, TaAl, WSiN, AlCu combination, or the like.

The memory elements 134 may be formed of switching oxides, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc.

The selectors 136 may each be formed of layers of materials, such as a TiN (Titanium Nitride) layer, a $NbO_2$ (Niobium dioxide) layer, and a TiN layer. In addition, current may flow between selected ones of the input lines 112 and the output lines 122 through a selector 136 and a memory element 134 of a memory cell 132. In this regard, each of the memory cells 132 may be individually addressed through application of a voltage across a selected pair of an input line 112 and an output line 122.

Turning now to FIGS. 2-5, there are respectively shown schematic diagrams of apparatuses 200, 300, 400, and 500, according to examples of the present disclosure. It should be understood that each of the apparatuses 200, 300, 400, and 500 respectively depicted in FIGS. 2-5 may include additional components and that some of the components described herein may be removed and/or modified without departing from the scopes of any of the apparatuses 200, 300, 400, and 500. According to an example, each of the apparatuses 200, 300, 400, and 500 may be a respective data storage apparatus.

Figure 2:
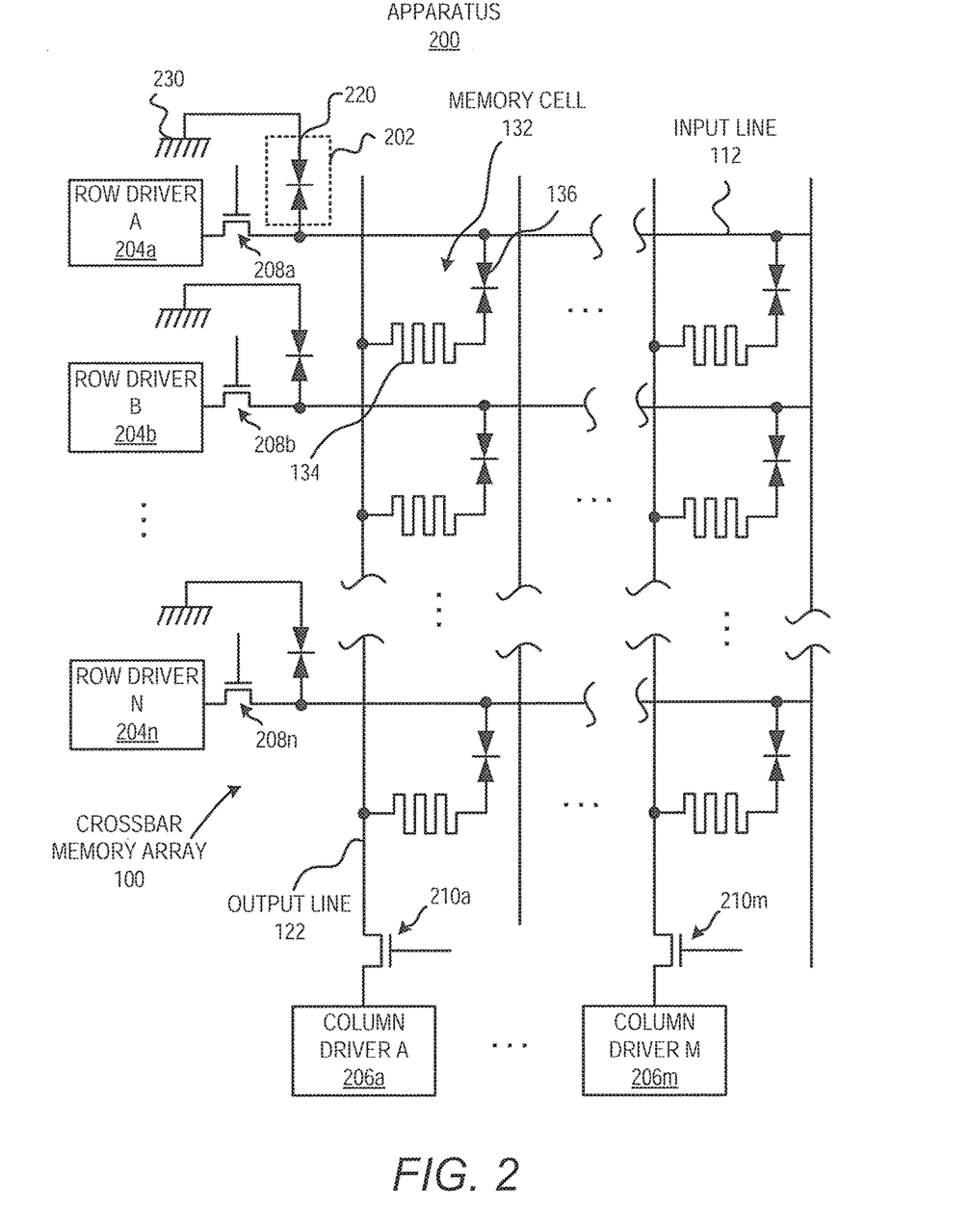
FIGS. 2-5, respectively, show schematic diagrams of apparatuses having crossbar memory arrays, according to examples of the present disclosure.

With reference first to FIG. 2, the apparatus 200 may generally include a crossbar memory array 100, compensation circuits 202, a plurality of row drivers 204a-204n, and a plurality of column drivers 206a-206m. The variables "n" and "m" may be any integer value greater than one and may differ from each other. As also shown, the crossbar memory array 100 includes a plurality of input lines 112, output lines 122, and memory cells 132, which are arranged in a n×m array.

Each of the row drivers 204a-204n may output a current onto an input line 112 through a respective transistor 208a-208n. In addition, each of the column drivers 206a-206m may modulate the bias of a respective output line 122 relative to an input line 112 through a respective transistor 210a-210m. Particularly, a current outputted by a row driver 204a may be directed through a particular memory cell 132 through activation of a particular column driver 206a. In this regard, each of the memory cells 132 may be individually addressed, e.g., written, read, etc., depending upon the voltage level applied by the row driver 204a. For instance, the row driver 204a may apply a larger voltage to cause a write operation to be performed on a memory cell 132 as compared to a read operation. Conversely, however, depending on a biasing scheme of the row drivers 204a-204n and the column drivers 206a-206m, each of the output lines 122 may function as an input line and each of the input lines 112 may function as an output line.

As also shown in FIG. 2, each of the memory cells 132 includes a memory element 134 in series with a selector 136. In addition, the selectors 136 are depicted as being connected to a respective input line 112 and the memory elements 134 are depicted as being connected to a respective output line 122. Each of the selectors 136 generally provides a high resistance when a bias voltage across a memory cell 132 is below a threshold voltage and provides a low resistance when the bias voltage across the memory cell 132 is equal to or greater than the threshold voltage. The selectors 136 may be connected in series with the memory elements 134 to prevent excessive sneak-path currents from reaching the memory elements 134 during writing of data to or reading of data from the memory elements 134. Thus, the selectors 136 may introduce high non-linearity in voltage-dependent current flows through the memory cells 132, thereby suppressing a current flow when the bias voltage across the memory cells 132 are at low voltages and abruptly allowing high current flow when the bias voltage is equal to or greater than the threshold voltage.

Some implementations of the selectors 136 in the memory array 100 may be inherently sensitive to temperature, and therefore may allow excessive current to flow through the selectors 136 at levels dependent on an ambient temperature or an instantaneously realized local temperature. Such temperature-dependent behavior of the selectors 136 may introduce variations in the performance of the memory array 100, skew the data being written to or read from the memory array 100, and in a worst case, permanently overwrite and damage the memory elements 134 connected in series with the respective selectors 136.

According to an example, the compensation circuits 202 are to compensate for the temperature-dependent behavior of the selectors 136 in the memory array 100. As shown in FIG. 2, each of the compensation circuits 202 may be connected to a respective input line 112, effectively branching off the path along the input line 112 between a row driver 204a and the memory cells 132.

In the example depicted in FIG. 2, the compensation circuits 202 include shunt devices 220, which may be identical or similar to the selectors 136 of the memory cells 132. Although the shunt devices 220 are depicted in FIG. 2 as being identical to the selectors 136, it should be understood that other types of shunt devices with temperature dependencies similar to that of the selectors 136 may be used in the compensation circuit 202. According to an example, the shunt devices 220 may be similar to the selectors 136, but may be fabricated to have different threshold voltages and response curves than the selectors 136 and be adequate for tuning the amount of current shunted. Particular examples of suitable materials for the shunt devices 220 may include $NbO_x$ (for instance, with a different O content than the $NbO_2$ in the selectors 136), a mix of $NbO_2$ and $SiO_2$, a mix of $NbO_2$ and $Al_2O_3$, etc. The shunt devices 220 may also be formed of semiconductor (amorphous or poly Si)-metal (Schottky) junction. In addition, the shunt devices 220 may be fabricated with a different process and on a different level (plane) than the selectors 136.

In other examples, the shunt devices 220 may, for example, be made of the same or similar materials as the selectors 136. According to a particular example, the shunt devices 220 may be fabricated simultaneously and with the same or similar materials as the selectors 136. In one respect, in instances in which the shunt devices 220 are made of the same or similar materials as the selectors 136, the shunt devices 220 will likely experience an identical or similar temperature dependency as the selectors 136. In addition, therefore, the shunt devices 220 will also likely experience a change in resistance state similar to the selectors 136 as discussed in greater detail below.

As discussed above, the selectors 136 may be made of three layers, including TiN, $NbO_2$, and TiN. In one example, the shunt devices 220 may also be made of the same three layers. It should however be clearly understood that the selectors 136 and the shunt devices 220 may be formed of other materials without departing a scope of the apparatus 200 disclosed herein.

As shown in FIG. 2, the first ends of the shunt devices 220 are connected to respective input lines 112 and the second ends of the shunt devices 220 are connected to ground 230. In other examples, the second ends of the shunt devices 220 may be connected to a bias voltage that is greater than zero. In any regard, when the voltage at an input line 112 is less than the threshold voltage, the shunt device 220 is not activated, i.e., remains in a high resistance state, and thus does not divert current from the input line 112. However, when the voltage through the input line 112 is equal to or greater than the threshold voltage, the shunt device 220 may be activated, i.e., switched to a low resistance state that allows current to flow more freely, forming a shunt path from the input line 112 to ground 230. As a result, when activated, the shunt device 220 may divert a portion of excessive current away from a memory cell 132, thereby preventing the excessive current from flowing into the memory element 134 of the memory cell 132.

More particularly, a shunt device 220 in the compensation circuit 202 may become activated when the row driver 204a generates a voltage pulse along an input line 112. A current associated with the voltage pulse may be divided into two parts: one part of the current flowing into a selected memory cell 132, and another part of the current flowing through the shunt device 220. When the voltage pulse from the row driver 204a is equal to or greater than the threshold voltage, e.g., the threshold voltage at which the selector 136 of the selected memory cell 132 switches from a high resistance state to a low resistance state, the shunt device 220 and the selector 136 may both become activated. The activation of the shunt device 220 and the selector 136 may allow an increase of current to flow through the shunt device 220 and the selector 136, respectively. Thus, a portion of the current, e.g., an excessive current, may flow through the shunt device 220 and to ground 230, thus reducing the amount of current flowing through the selector 136 and to the memory element 134. If the shunt device 220 were absent from the compensation circuit 202, an increase in ambient temperature would lower the threshold voltage of the selector 136, thereby increasing the current flowing through the selector 136 and the memory element 134. Accordingly, the shunt device 220 may divert excessive current away from the memory element 134 and prevent excessive current from flowing into the memory element 134, which may cause mis-reads or unintended writes, at elevated temperatures.

When the shunt device 220 diverts excessive current away from the memory cell 132, the diversion of the excessive current may effectively increase the threshold voltage, and may compensate for the lowering of the threshold voltage due to the temperature increase. With an appropriate level of series resistance or wire length in the shunt path of the shunt device 220, the selector 136 in the memory cell 132 may operate in a nearly temperature invariant manner. Therefore, the shunt devices 220 may compensate for the temperature dependencies of the selectors 136.

In another example, the voltage pulse delivered from the row driver 204a to the input line 112 may also be a current pulse, with similar division of current flow into the shunt path passively limiting and controlling the amount of current flowing through the memory cells 132.

According to an example, the row drivers 204a-204n may control operations of storing or writing data to the memory cells 132. In addition, the column drivers 206a-206m may control operations of retrieving or reading data from the memory cells 132.

Figure 3:
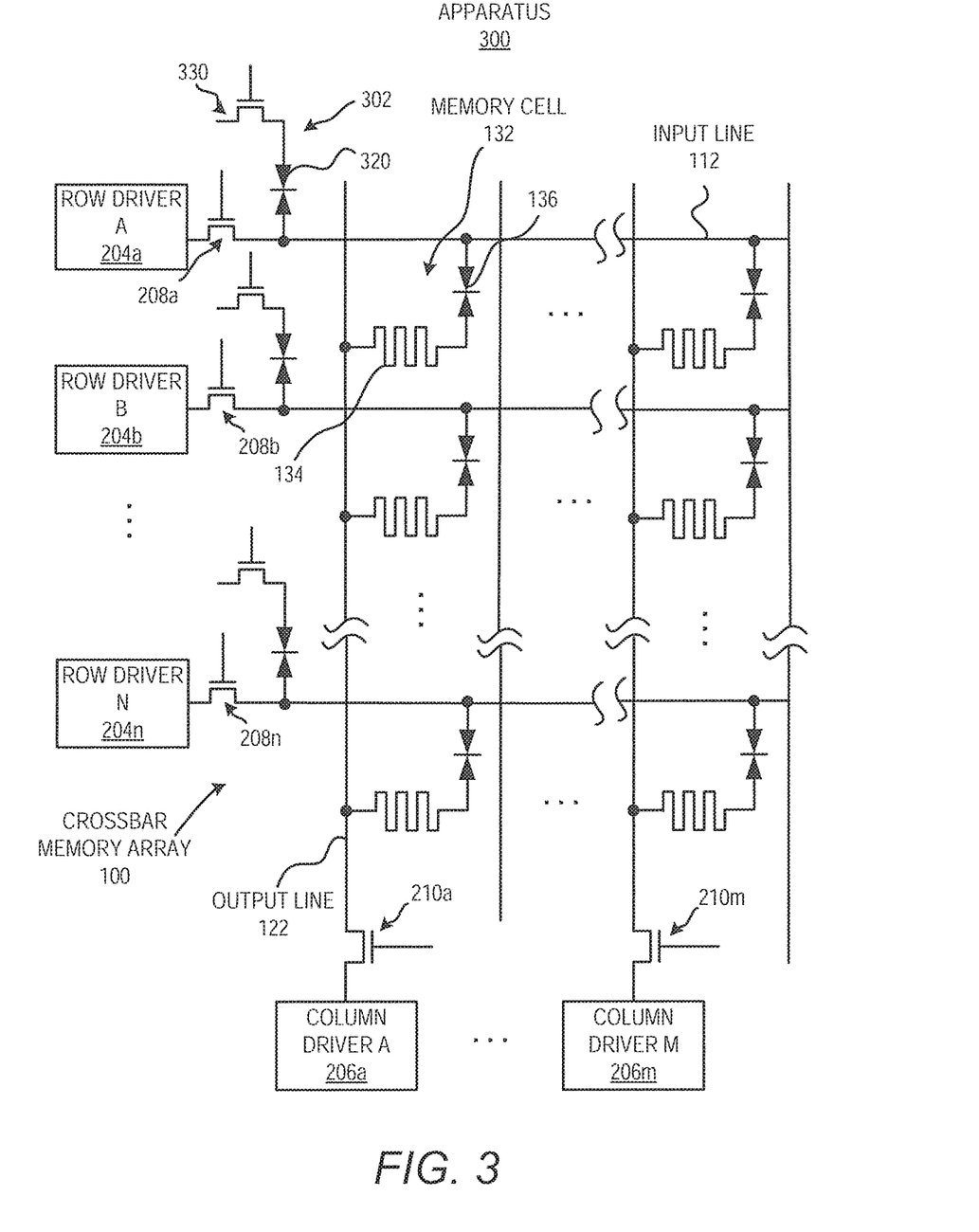

With reference now to FIG. 3, the apparatus 300 is depicted as including many of the same features as the apparatus 200 depicted in FIG. 2. However, the apparatus 300 is depicted as including compensation circuits 302 that each includes a shunt device 320 connected in series with a transistor 330. According to an example, the transistors 330 may be activated to regulate the resistance of a shunt path in the compensation circuits 302 formed by the activated shunt device 320. Particularly, the transistors 330 may be triggered to admit current flow simultaneously with the row drivers 204a-204n, or with a delay (for instance, of about several 10 s of nanoseconds). Each of the transistors 330 may be put in a subthreshold state to admit increasing current up to a level corresponding to a saturation current of the transistor so that the diverted current would not exceed the saturation current amount and would have an upper limit. In this regard, the shunt devices 320 may operate similarly to the shunt devices 220 in FIG. 2 to divert excessive current from the memory cells 132. In addition, the first ends of the transistors 330 are connected to respective shunt devices 320 and the second ends of the transistors 330 may be connected to ground or to a bias voltage that is greater than zero (not shown). In another example, the second ends of the transistors 330 may be connected to an input of a reading circuit (not shown) to enable the reading circuit to perform a read simultaneously as a writing voltage pulse is applied.

Figure 4:
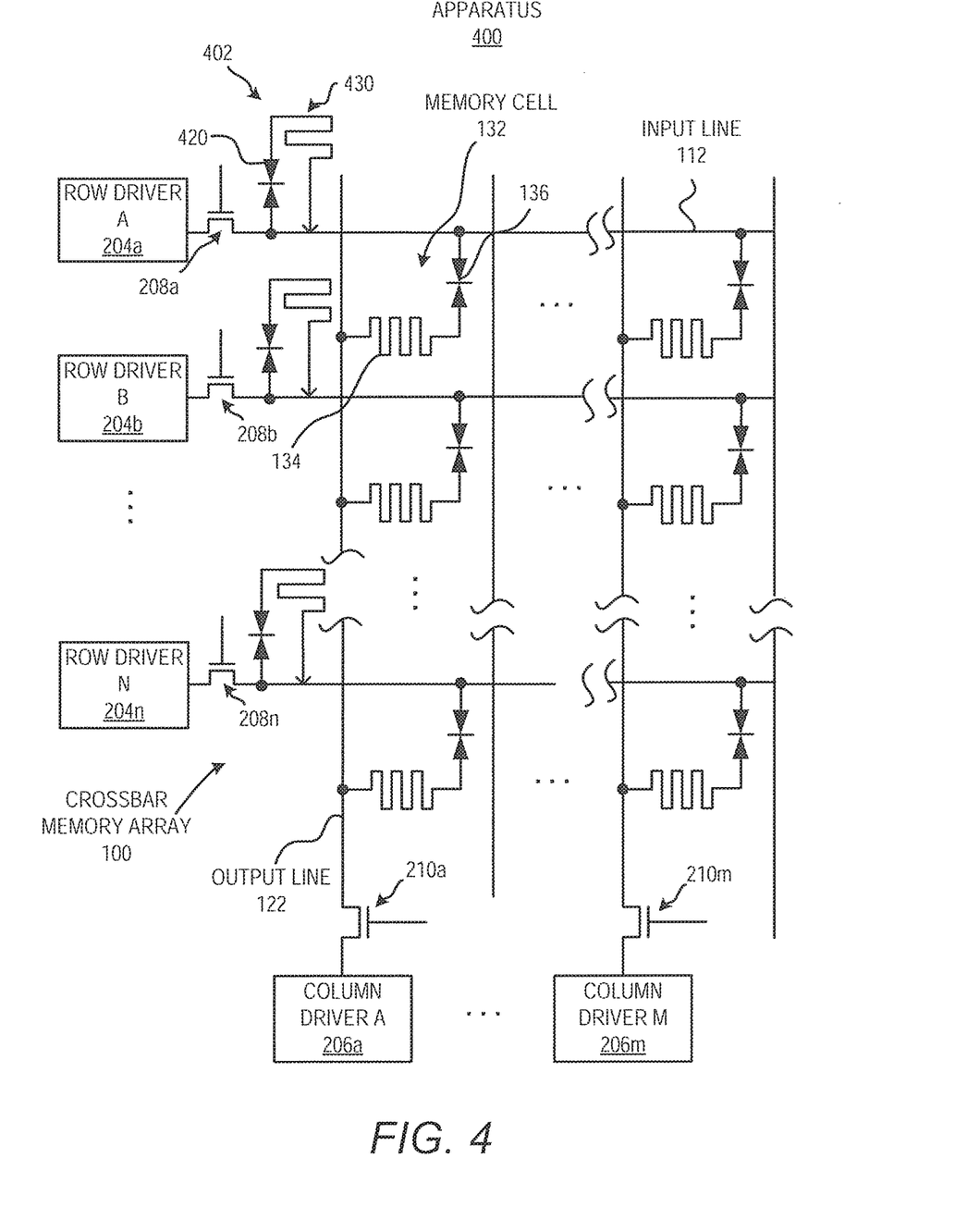

Turning now to FIG. 4, the apparatus 400 is depicted as including many of the same features as the apparatus 200 depicted in FIG. 2. However, the apparatus 400 is depicted as including compensation circuits 402 that each includes a shunt device 420 having a first end connected to an input line 112 and a second end leading back to the input line 112 via a delay line 430. As such, when the shunt device 420 is activated, a shunt path formed by the activated shunt device 420 and the delay line 430 is parallel to the input line 112 and delays a portion of the voltage pulse being delivered to the memory cells 132 along the input line 112. By delaying the voltage pulse, the thermal effect of the shunted component of the current pulse may be negated or sufficiently delayed to negate the lowering of the threshold voltage for activation of the selector 136 due to an elevated temperature.

Figure 5:
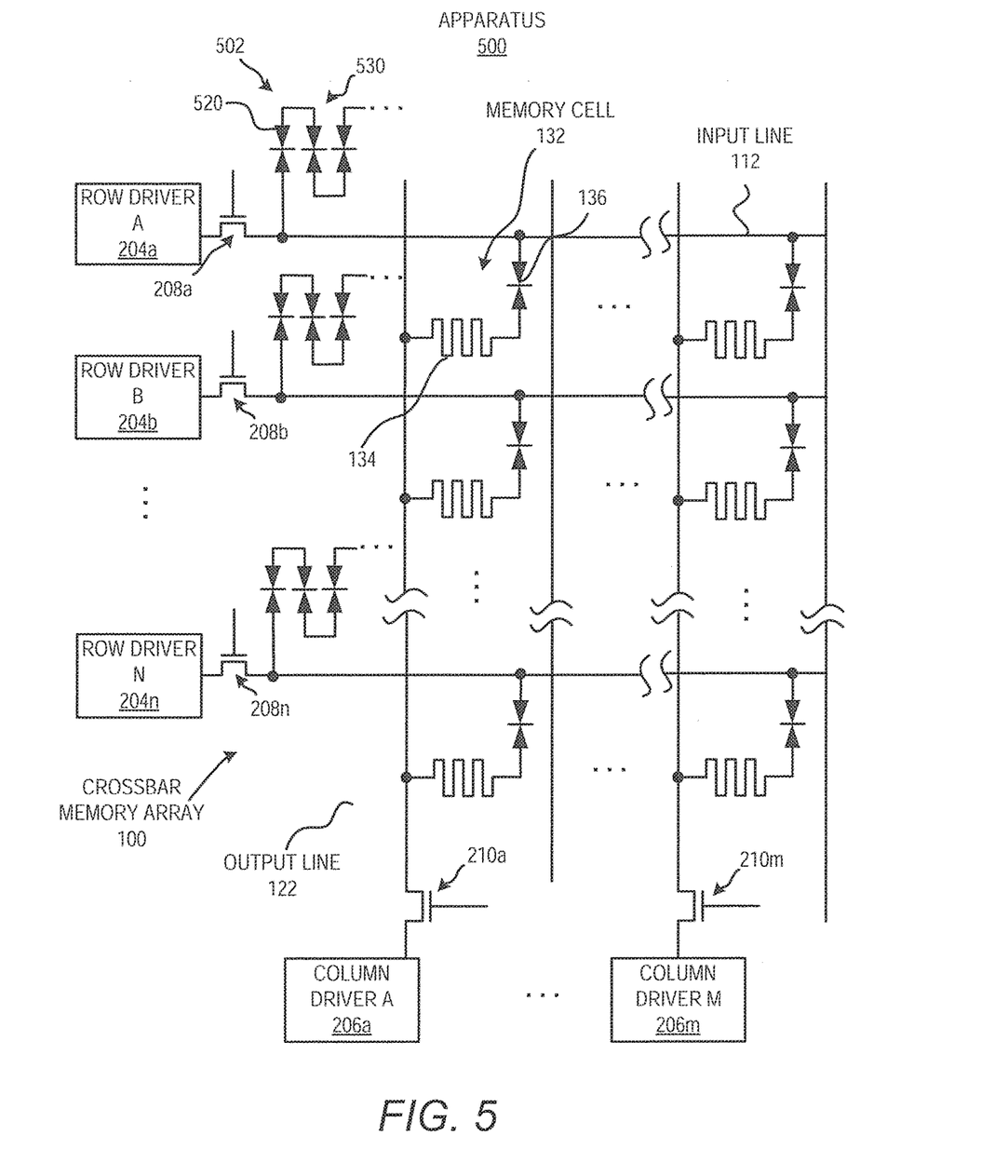

Turning now to FIG. 5, the apparatus 500 is depicted as including many of the same features as the apparatus 200 depicted in FIG. 2. However, the apparatus 500 is depicted as including compensation circuits 502 that each includes a shunt device 520 connected in series with a number of additional shunt devices 530. The series of shunt devices 520-530 may be placed in the shunt path of the compensation circuit 502 in order to increase the resistance of the shunt path. The number and resistance of the shunt devices 520-530 may be adjusted to reach a desired level of compensation. According to an example, the shunt devices 520-530 may be made of similar materials as the selectors 136 or any type of suitable resistive elements. In addition, although not shown, a last shunt device 530 in the series may be connected to ground or to a bias voltage that is greater than zero.

Figure 6:
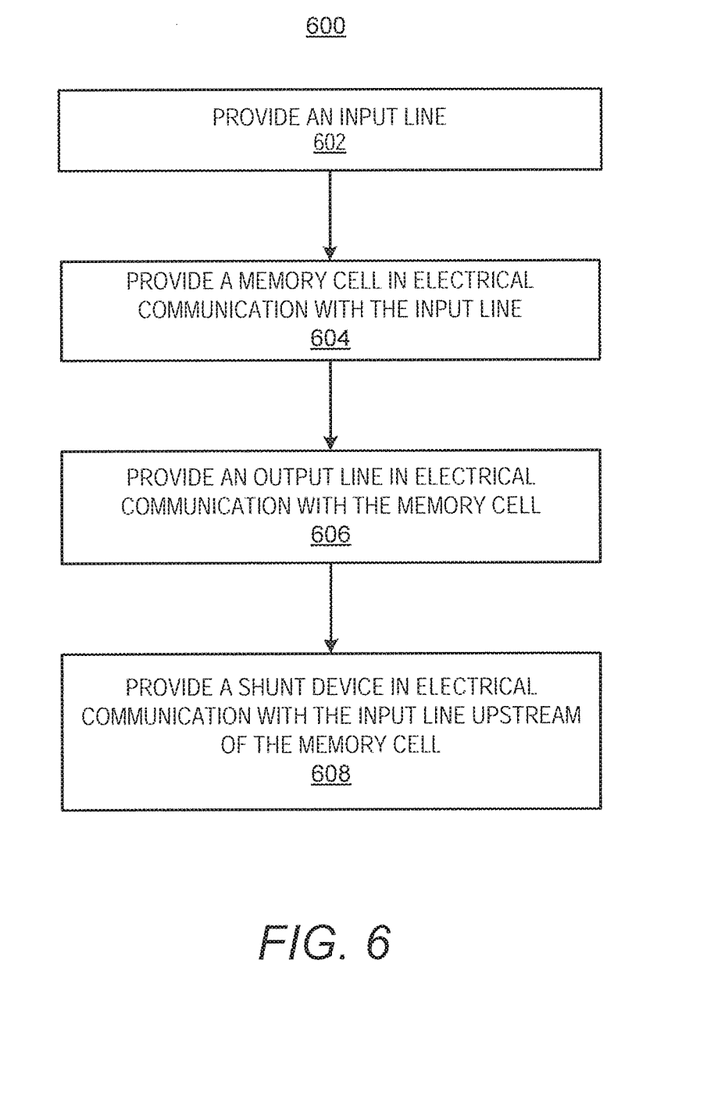
FIG. 6 shows a flow chart of a method for fabricating an apparatus, according to an example of the present disclosure.

FIG. 6 illustrates a flow chart of a method 600 for fabricating an apparatus, according to an example of the present disclosure. It should be apparent to those of ordinary skill in the art that the method 600 represents a generalized illustration and that other operations may be added or existing operations may be removed, modified or rearranged without departing from the scopes of the method 600. In addition, the method 600 may be repeated as desired or needed to form a crossbar memory array 100 composed of multiple memory cells 132 of the apparatus.

At block 602, an input line 112 may be provided. The input line 112 may be provided, e.g., formed, through any suitable formation process, such as, chemical vapor deposition, sputtering, etching, lithography, etc. As discussed above, the input line 112 may be formed of an electrically conductive material such as AlCu, AlCuSi, AlCuSi with a barrier layer, such as TiN, or the like.

At block 604, a memory cell 132 may be provided in electrical communication with the input line 112. The memory cell 132, and particularly, the memory element 134 and selector 136, may be provided, e.g., formed, through any suitable formation process such as sputtering, pulse laser deposition, atomic layer deposition, etc.

At block 606, an output line 122 may be provided in electrical communication with the memory cell 132. The output line 122 may be provided, e.g., formed, through a formation process, such as E-beam evaporation, chemical vapor deposition, sputtering, atomic layer deposition, etching, (imprint) lithography, etc. As discussed above, the output line 122 may be provided to be in a crossed relationship with respect to the input line 112.

At block 608, a shunt device 220, 320, 420, 520 may be provided in electrical communication with the input line 112 at a location that is upstream of the memory cell 132 with respect to a voltage driver, e.g., row driver 204a. According to an example, the shunt device 220, 320, 420, 520, may be provided during the forming of the selectors 136. In addition to the shunt device 220, 320, 420, 520, additional components may be provided to form a compensation circuit 202, 302, 402, 502 as described above with respect to the apparatuses 200, 300, 400, and 500.

What has been described and illustrated herein are examples of the disclosure along with some variations. The terms, descriptions and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

What is claimed is:

1. An apparatus comprising:
   an input line;
   an output line;
   a memory cell connected between the input line and the output line, the memory cell comprising:
      a memory element;
      a selector connected in series with the memory element and to the input line; and
   a shunt device connected to the input line, wherein the shunt device is to divert a portion of current away from the memory cell in response to a voltage at the input line being greater than a threshold voltage.

2. The apparatus of claim 1, wherein the shunt device is made of a same material as the selector and wherein the threshold voltage is equivalent to a threshold voltage at which the selector changes from a high resistance state to a low resistance state.

3. The apparatus of claim 1, wherein the shunt device is connected between the input line and a bias voltage.

4. The apparatus of claim 1, wherein the shunt device includes a first end connected to the input line and a second end connected to the input line through a delay line.

5. The apparatus of claim 4, wherein the delay line includes an additional shunt device.

6. The apparatus of claim 1, wherein the shunt device is connected between the input line and a transistor.

7. The apparatus of claim 6, wherein the transistor is connected between the shunt device and a reading circuit.

8. The apparatus of claim 1, wherein the shunt device exhibits the same temperature sensitivity as the selector.

9. A method comprising:
   providing an input line;
   providing a memory cell electrical communication with the input line, wherein the memory cell comprises a memory element connected in series with a selector;
   providing an output line in electrical communication with the memory cell; and
   providing a shunt device in electrical communication with the input line at a location that is upstream of the memory cell with respect to a voltage driver, wherein the shunt device is to divert a portion of current away from the memory cell in response to a voltage at the input line being greater than a threshold voltage.

10. The method of claim 9, wherein the shunt device is made of a same material as the selector of the memory cell wherein the threshold voltage is equivalent to a threshold voltage at which the selector changes from a high resistance state to a low resistance state.

11. The method of claim 9, wherein providing the shunt device further comprises connecting the shunt device between the input line and a bias voltage.

12. The method of claim 9, wherein providing the shunt device further comprises connecting a first end of the shunt device to the input line and a second end of the shunt device to the input line through a delay line.

13. The method of claim 9, wherein providing the shunt device further comprises connecting the shunt device between the input line and a transistor.

14. The method of claim 13, further comprising connecting the transistor between the shunt device and a reading circuit.

15. A crossbar memory array comprising:
   a plurality of input lines;
   a plurality of output lines positioned in crossed relationships with the plurality of input lines to form a plurality of junctions between the input lines and the output lines;
   a plurality of memory cells, wherein each memory cell is positioned at a respective junction, is connected between an input line and an output line, and includes a memory element and a selector, wherein the memory element is connected in series with the selector; and
   a plurality of shunt devices connected to the input lines, wherein the plurality of shunt devices are to divert a portion of current away from the memory cells in response to voltages at the input lines being greater than a threshold voltage, wherein the threshold voltage is equivalent to a threshold voltage at which the selector changes from a high resistance state to a low resistance state.

16. The crossbar memory array of claim 15, wherein the shunt device is made of a same material as the selector.

* * * * *